(12) United States Patent
Wei et al.

(10) Patent No.: US 7,710,008 B2
(45) Date of Patent: May 4, 2010

(54) FIELD EMISSION ELECTRON SOURCE HAVING CARBON NANOTUBE AND MANUFACTURING METHOD THEREOF

(75) Inventors: Yang Wei, Beijing (CN); Liang Liu, Beijing (CN); Wei Wei, Beijing (CN); Kai-Li Jiang, Beijing (CN); Shou-Shan Fan, Beijing (CN)

(73) Assignees: Tsinghu University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 664 days.

(21) Appl. No.: 11/514,595

(22) Filed: Sep. 1, 2006

(65) Prior Publication Data

US 2010/0084957 A1    Apr. 8, 2010

(30) Foreign Application Priority Data

Mar. 22, 2006   (CN) .......................... 200610060018

(51) Int. Cl.
*H01J 1/62* (2006.01)
(52) U.S. Cl. ....................... 313/311; 313/495
(58) Field of Classification Search ................ 313/309, 313/336, 351, 495–497, 310, 311, 504–506; 445/23–25
See application file for complete search history.

(56) References Cited

U.S. PATENT DOCUMENTS

| | | | |
|---|---|---|---|
| 6,504,292 B1 | 1/2003 | Choi et al. | |
| 6,879,143 B2 | 4/2005 | Nagahara et al. | |
| 2004/0036401 A1 | 2/2004 | Konuma et al. | |
| 2004/0092050 A1 | 5/2004 | Shuy et al. | |
| 2004/0192153 A1 | 9/2004 | Liu et al. | |
| 2005/0035701 A1 | 2/2005 | Choi et al. | |
| 2005/0116214 A1 | 6/2005 | Mammana et al. | |
| 2005/0260453 A1 | 11/2005 | Jiao et al. | |
| 2006/0057053 A1 | 3/2006 | Otobe et al. | |
| 2006/0097615 A1 | 5/2006 | Tsakalakos et al. | |

FOREIGN PATENT DOCUMENTS

| | | |
|---|---|---|
| JP | P2005-063802 A | 3/2005 |
| JP | P2006-247832 A | 9/2006 |
| TW | 231518 | 4/2005 |
| TW | M267617 | 6/2005 |
| TW | 241414 B | 10/2005 |
| TW | 246103 | 12/2005 |
| TW | 248630 | 2/2006 |
| WO | WO01/61719 A1 | 8/2001 |

*Primary Examiner*—Joseph L Williams
(74) *Attorney, Agent, or Firm*—Clifford O. Chi

(57) ABSTRACT

A field emission electron source (10) includes a conductive base (12), a carbon nanotube (14), and a film of metal (16). The conductive base includes a top (122). One end (142) of the carbon nanotube is electrically connected with the top of the conductive base. The other end (144) of the carbon nanotube extends outwardly away from the top of the conductive base. The film of metal is formed on the nearly entire surface of the carbon nanotube and at least on the portion of the top of the conductive base proximate the carbon nanotube. A method for manufacturing the described field emission electron source is also provided.

16 Claims, 3 Drawing Sheets

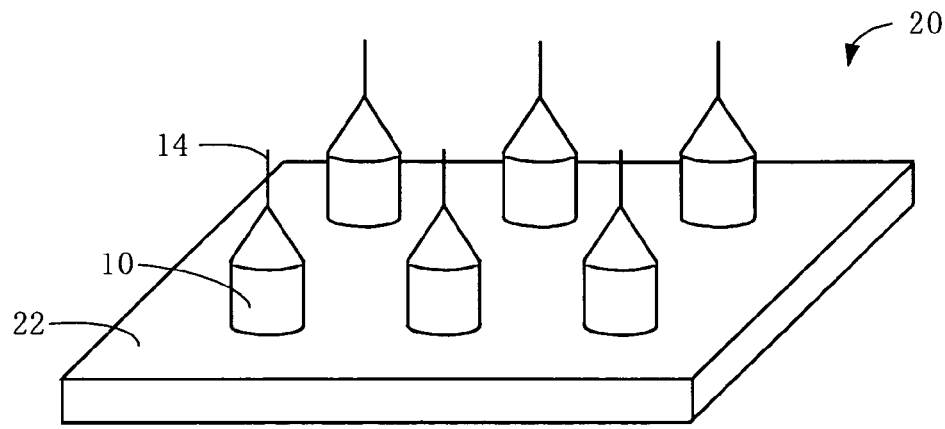

FIG. 3

| providing a pair of conductive bases each having a top, the tops being spaced apart from and opposite to each other, the tops being immersed in a solution having carbon nanotubes dispersed therein; |

↓

| applying an alternating voltage between the two conductive bases, thereby causing at least one carbon nanotube to become assembled between the tops of the conductive bases; |

↓

| shutting off the alternating voltage between the conductive bases and removing the solution between the tops of the two conductive bases; |

↓

| detaching one of the two conductive bases in a matter such that the carbon nanotube remains connected with one of the tops of the conductive bases; and |

↓

| forming a film of metal on the substantial portion of a surface of the carbon nanotube and on at least a portion of the top of the conductive base proximate the carbon nanotube. |

FIG. 4

FIELD EMISSION ELECTRON SOURCE HAVING CARBON NANOTUBE AND MANUFACTURING METHOD THEREOF

RELATED APPLICATIONS

This application is related to commonly-assigned applications entitled, "FIELD EMISSION ELECTRON SOURCE HAVING CARBON NANOTUBE", filed Sep. 1, 2006, Ser. No. 11/514,596, and "METHODS FOR MAKING FIELD EMISSION ELECTRON SOURCE HAVING CARBON NANOTUBE", Sep. 1, 2006, Ser. No. 11/514,583, the contents of each of which are hereby incorporated by reference thereto.

BACKGROUND

1. Field of the Invention

The invention relates generally to field emission electron sources and manufacturing methods thereof and, more particularly, to field emission electron sources employing a carbon nanotube and a manufacturing method thereof.

2. Discussion of Related Art

Carbon nanotubes (also herein referred to as CNTs) are very small tube-shaped structures essentially having a composition of a graphite sheet in a tubular form. Carbon nanotubes have interesting and potentially useful electrical and mechanical properties and offer potential for various uses in electronic devices. Carbon nanotubes also feature extremely high electrical conductivity, very small diameters (much less than 100 nanometers), large aspect ratios (i.e. length/diameter ratios) (greater than 1000), and a tip-surface area near the theoretical limit (the smaller the tip-surface area, the more concentrated the electric field, and the greater the field enhancement factor). These features tend to make carbon nanotubes ideal candidates for field emission electron sources.

Generally, a cnt field emission electron source includes a conductive base and a carbon nanotube formed on the conductive base. The carbon nanotube acts as an emitter of the field emission electron source. The methods adopted for forming the carbon nanotube on the conductive base mainly include mechanical methods and in-situ synthesis methods. One mechanical method is performed by placing a synthesized carbon nanotube on a conductive base by an Atomic force microscope (AFM), then fixing the carbon nanotube on the conductive base by conductive pastes or adhesives. The mechanical method is relatively easy. However, the precision and efficiency thereof are relatively low. Furthermore, the electrical connection between the conductive base and the carbon nanotube tends to be poor because of the limitations of the conductive pastes used therebetween. Thus, the field emission characteristics of the carbon nanotube are generally unsatisfactory.

One in-situ synthesis method is performed by coating metal catalysts on a conductive base and synthesizing a carbon nanotube on the conductive base directly by means of chemical vapor deposition (CVD). The in-situ synthesis method is relatively easy. Furthermore, the electrical connection between the conductive base and the carbon nanotube is typically good because of the direct engagement therebetween. However, the mechanical connection between the carbon nanotube and the conductive base often is relatively weak and thus unreliable. Thus, in use, such a carbon nanotube is apt, after a period of time, to break away from the conductive base due to the stress of the electric field force. Such breakage would damage the field emission electron source and/or decrease its performance. Furthermore, in the in-situ synthesis method, control of the growth direction of the carbon nanotube is difficult to achieve during the synthesis process. Thus, the production efficiency thereof is relatively low, and the controllability thereof is less than desired. Still furthermore, the in-situ synthesis method has a relatively high cost.

What is needed, therefore, is a field emission electron source which has a firm mechanical connection and good electrical connection between the carbon nanotube and the conductive base and which thus tends to have satisfactory field emission characteristics.

What is also needed is a method for manufacturing the above-described field emission electron source, the method having a relatively low cost, relatively high production efficiency, and an improved controllability.

SUMMARY

In one embodiment, a field emission electron source includes a conductive base, a carbon nanotube, and a film of metal. The conductive base includes a top. The carbon nanotube includes a first end and a second end. The first end of the carbon nanotube is electrically and mechanically connected with the top of the conductive base. The second end of the carbon nanotube extends outwardly away from the top of the conductive base. The film of metal is formed on substantial portion of a surface of the carbon nanotube and on at least a portion of the top of the conductive base proximate the carbon nanotube.

In another embodiment, a method for manufacturing the described field emission electron source includes the following steps: (a) providing a pair of conductive bases each having a top, the tops being spaced apart from and opposite to each other, the tops being immersed in a solution having carbon nanotubes dispersed therein; (b) applying an alternating voltage between the two conductive bases, thereby causing at least one carbon nanotube to become assembled between the tops of the conductive bases; (c) shutting off the alternating voltage between the conductive bases and removing the solution between the tops of the two conductive bases; (d) detaching one of the two conductive bases in a matter such that the carbon nanotube remains connected with one of the tops of the conductive bases; and (e) forming a film of metal on the substantial portion of a surface of the carbon nanotube and on at least a portion of the top of the conductive base proximate the carbon nanotube.

Other advantages and novel features of the present field emission electron source and the related manufacturing method will become more apparent from the following detailed description of preferred embodiments when taken in conjunction with the accompanying drawings.

BRIEF DESCRIPTION OF THE DRAWINGS

Many aspects of the present field emission electron source and the related manufacturing method can be better understood with reference to the following drawings. The components in the drawings are not necessarily to scale, the emphasis instead being placed upon clearly illustrating the principles of the present field emission electron source and the related manufacturing method.

FIG. 3 is an isometric view of a field emission array formed by providing a plurality of the field emission electron sources of FIG. 1;

FIG. 4 is a flow chart showing a method for manufacturing the field emission electron source of FIG. 1;

Figure 1:
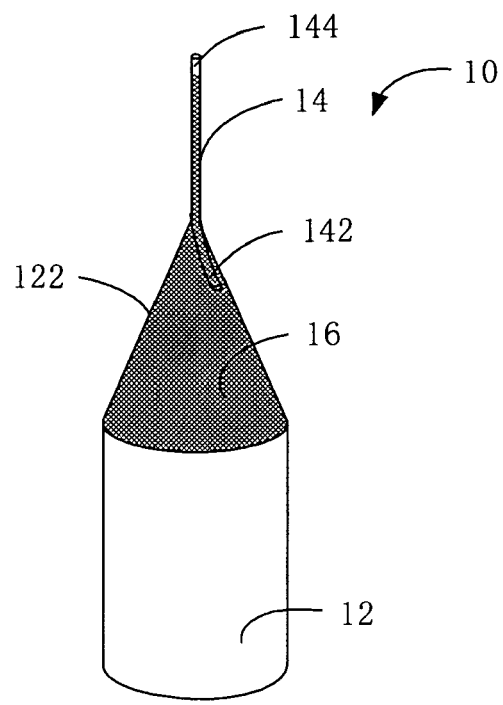
FIG. 1 is an isometric view of a field emission electron source in accordance with an exemplary embodiment of the present device, the field emission electron source incorporating a carbon nanotube.

Corresponding reference characters indicate corresponding parts throughout the several views. The exemplifications set out herein illustrate at least one preferred embodiment of the present field emission electron source and the related manufacturing method, in one form, and such exemplifications are not to be construed as limiting the scope of the invention in any manner.

DETAILED DESCRIPTION OF PREFERRED EMBODIMENTS

Reference will now be made to the drawings to describe embodiments of the present field emission electron source and the related manufacturing method, in detail.

Figure 2:
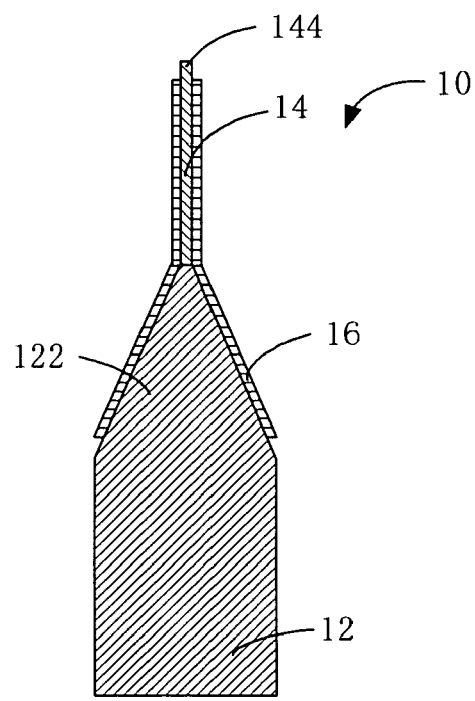
FIG. 2 is a longitudinal sectional view of the field emission electron source of FIG. 1.

FIG. 1 is an isometric view of a field emission electron source 10, in accordance with an exemplary embodiment of the present device, and FIG. 2 is a longitudinal sectional view of the field emission electron source 10 of FIG. 1. As shown in FIGS. 1 and 2, the field emission electron source 10 includes a conductive base 12, a carbon nanotube 14, and a film of metal 16. The conductive base 12 includes a tapered top 122. A first end 142 of the carbon nanotube 14 is electrically connected with the tapered top 122 of the conductive base 12. The first end 142 is initially mechanically attached directly to the top 122 of conductive base 12 via van der Waals attractions therebetween. A second end 144 of the carbon nanotube 14 extends outwards away from the top 122 of the conductive base 12. The film of metal 16 is advantageously formed on nearly the entire surface of the carbon nanotube 14 and the tapered top 122 of the conductive base 12. This film 16 enhances the mechanical connection between the carbon nanotube 14 and the conductive base 12 and reduces the electrical contact resistance therebetween. The second end 144 of the carbon nanotube 14 extends out of the film of metal 16 (i.e., the distal portion is of the second end 144 is not covered by the film 16). This uncovered distal portion facilitates a sufficient use of the field emission characteristics of the carbon nanotube 14.

The conductive base 12 is advantageously made of a high-melting, oxidation resistant conductive material, preferably comprised of a metal selected from a group consisting of tungsten, gold, molybdenum, and platinum. Most preferably, the conductive base 12 is made of tungsten. A diameter of the conductive base 12 is about in the range from 10 to 1000 micrometers. The carbon nanotube 14 can be single-walled or multi-walled. Preferably, the carbon nanotube 14 is multi-walled. A diameter of the carbon nanotube 14 is approximately in the range from 1 to 50 nanometers, and a length thereof is about in the range from 10 to 100 micrometers. Preferably, the diameter of the carbon nanotube 14 is 20 nanometers, and the length thereof is 50 micrometers. The film of metal 16 is advantageously made of gold but could, alternatively, be made of another noble metal (e.g., Pt, Pd, Ta) or noble metal alloy. A thickness of the film of metal 16 is in the range of about from 1 to 100 nanometers. Preferably, the thickness of the film of metal 16 is 20 nanometers.

It is can be understood that the top 122 of the conductive base 12 can also be cone-shaped or column-shaped. The film of metal 16 can further be formed on a main body of the conductive base 12. At a minimum, the film of metal 16 needs cover the portion of the carbon nanotube 14 adjacent the top 122 and, likewise, the portion of the top 122 adjacent the carbon nanotube 14, in order to achieve the desired mechanical and electrical connection therebetween. It is also noted that by covering a substantial percentage of the length of the carbon nanotube 14 with the film of metal 16, the carbon nanotube 16 is effectively reinforced along that coated length, reducing the likelihood of mechanical failure.

FIG. 3 is an isometric view of a field emission array 20 that includes a plurality of field emission electron sources 10 of FIG. 1. Referring to FIG. 3, the field emission array 20 includes a cathode layer 22 and a plurality of field emission electron sources 10 formed on the cathode layer 22. The carbon nanotubes 14 of the respective field emission electron sources 10 are substantially parallel to each other and are substantially perpendicular to the cathode layer 22.

Figure 5:
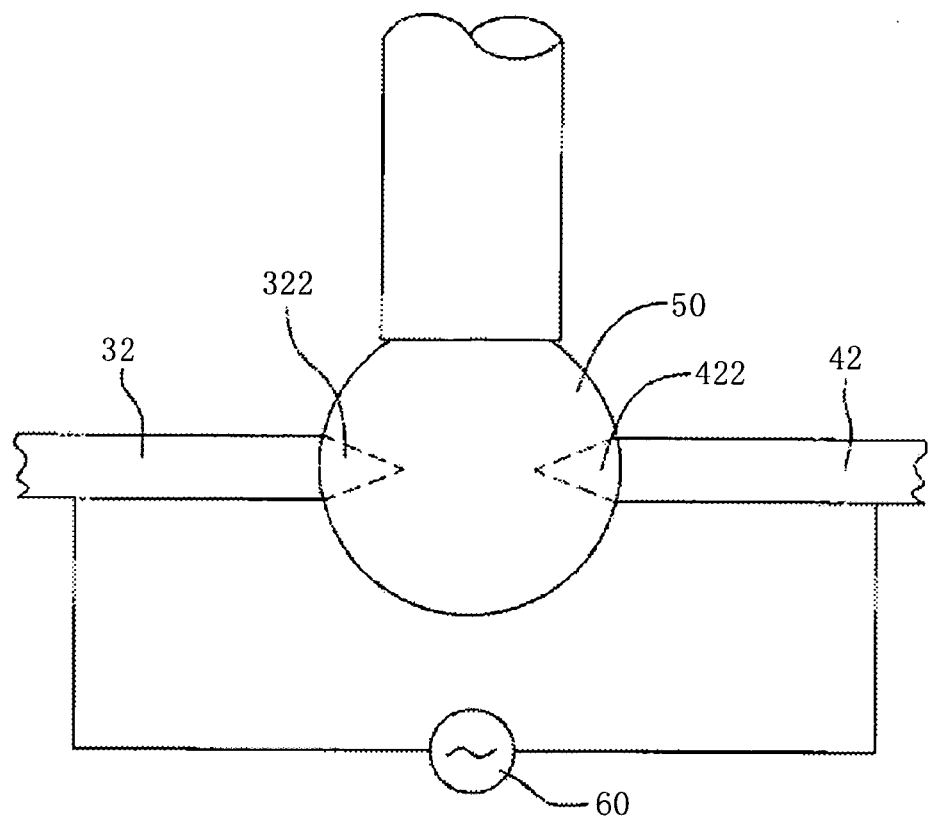
FIG. 5 is a schematic, side view of a device adapted for manufacturing the field emission electron source of FIG. 1.

Referring to FIGS. 4 and 5, a method for manufacturing the field emission electron source 10 includes the following steps:

step (a), providing a pair of conductive bases 32, 42 each having a tapered top 322, 422, the tapered top 322, 422 being spaced apart from and opposite to each other, the respective tapered tops 322, 422 being immersed in a solution 50 having carbon nanotubes 14 dispersed therein;

step (b), applying a voltage 60 between the two conductive bases 32, 42, thereby at least one carbon nanotube 14 being assembled between the tapered top 322, 422 of the conductive bases 32, 42 and a current being formed between the conductive bases 32, 42;

step (c), shutting off the current between the conductive bases 32, 42 and removing the solution 50 between the tapered tops 322, 422 of the two conductive bases 32, 42;

step (d), detaching the two conductive bases 32, 42, a given carbon nanotube 14 resultingly being connected with at least one of the tapered top 322, 422 of the conductive bases 32, 42; and step (e), forming a film of metal 16 on at least a substantial portion of the surface of the given carbon nanotube 14 and on at least the portion of the top 322, 422 of the corresponding conductive base 32, 42 to which the carbon nanotube 14 is attached, in order to form the field emission electron source 10.

In the preferred embodiment, the conductive bases 32, 42 are advantageously made of tungsten or alloys thereof. The diameters of bottoms of the tapered tops 322, 422 of the conductive bases 32, 42 are about in the range from 10 to 1000 micrometers.

It is can be understood that the conductive bases 32, 42 can made of another oxidation-resistant conductive material, such as gold, molybdenum or platinum. The tops 322, 422 can also be, e.g., cone-shaped or column-shaped. If the tops 322, 422 each have flat top surfaces, the tops 322, 422 should be arranged with parts of the top surfaces facing each other, for example, edges of the top surfaces facing each other. A distance between the tops 322, 422 is determined by a length of the carbon nanotube. Preferably, the distance between the top 322, 422 is similar to the length of the carbon nanotube, in order to facilitate the assembly. Generally, the distance is smaller than about 100 micrometers. Preferably, the distance is smaller than about 10 micrometers.

The solution 50, beneficially, includes isopropanol, which is used as the main solvent, and ethyl cellulose, which is used as the stabilizer. The carbon nanotubes 14 are uniformly dispersed in the solution 50 by means of ultrasonic oscillation, the solution 50 and carbon nanotubes 14 together comprising a suspension. It is can be understood that the solution 50 could be prepared by utilizing other similar suitable main solvents and/or stabilizers. Furthermore, other treating steps such as filtrating could be used to obtain the stable uniform solution 50. It is recognized that the higher the concentration of the carbon nanotubes 14 in the solution 50, the greater the numbers of the carbon nanotubes 14 that may be connected between the tops 322, 422. Thus, the numbers of the carbon nanotubes 14 that is to be subsequently connected between the tops 322, 422 can be controlled by adjusting the concentration of the carbon nanotubes 14 in the solution 50. If, for example, only one carbon nanotube 14 is desired to connect between the tops 322, 422, the concentration of the carbon nanotubes 14 in the solution 50 should be as low as possible and still allow for nanotube attachment within a desired time frame.

The solution 50 can be provided into and/or removed from the volume proximate the tops 322, 422 of the conductive bases 32, 42 by, e.g., straws, pipettes, injectors and so on. The volume of the solution 50 should not be too large, so as to not overly minimize the opportunity of interaction between the carbon nanotubes 14 carried thereby and the tops 322, 422. It is suitable that both the tops 322, 422 can be sufficiently immersed in the solution 50. Alternatively, the suitable solution 50 can be put in a container, such as a beaker, and the tops 322, 422 of the conductive bases 32, 42 can be directly immersed in/covered with the solution 50. When the solution 50 needs to be separated from the tops 322, 422, the tops 322, 422 can be removed out of the solution 50 directly.

In step (b), the voltage 60 is preferably an A.C. (alternating current) voltage. The A.C. voltage 60 advantageously has a peak value of about 10 volts or less and has a frequency in the range from about 1000 Hz to about 10 MHz. Generally, the A.C. voltage 60 could be applied for a time period in the range from about several seconds to several tens of seconds, until at least one of the carbon nanotubes 14 is connected to at least one of the tops 322, 422. That is, the method takes relatively little time and enables a high manufacturing efficiency to be attained. It is further to be noted that even if a given carbon nanotube 14 attaches to only one of the tops 322, 422 in this process, it will still tend to align toward the opposing one of the tops 322, 422, due to the opposite polarity associated therewith. This tendency to align based on polarity actually helps ensure that a given carbon nanotube 14 will indeed be substantially perpendicular to its respective conductive base 32, 42.

More specifically, the present method essentially operates based on the principle of double-directional electrophoresis. Once the A.C. voltage 60 is applied between the conductive bases 32, 42, an A.C. electrical field is correspondingly established between the tops 322, 422 of the conductive bases 32, 42. The carbon nanotubes 14 in the solution 50 are then forced to move toward a direction along which the electrical field intensity increases. Accordingly, the carbon nanotubes tend to extend/align toward the opposing tops 322, 422, between which the electrical field intensity is the highest. Eventually, at least one carbon nanotube 14 may be connected to at least one of the tops 322, 422, thus extending between, if not connected, to both tops 322, 422. By the present method, the carbon nanotube 14 can be firmly secured between the tops 322, 422 via Van der Waals attractions therebetween.

In the step (d), the conductive bases 32, 42 are moved along opposite directions by a steady foreign force and separate from each other gradually. Such movement ultimately causes the carbon nanotube 14 to detach from at least one of the conductive bases 32, 42 (preferably just detaching from one of the conductive bases 32, 42, in order to potentially yield the desired nanotube/base combination). Due to the different lengths of the two ends of the carbon nanotube 14 being attached on the bases 32, 42, respectively, after the detaching process, the carbon nanotube 14 would generally be attached on the top of one conductive base 32, 42. Preferably, the shorter the length/amount of an end of the carbon nanotube 14 that is attached on/to a given base 32, 42, the easier that end of the carbon nanotube 14 is detached from the given base 32, 42. It is to be understood that it is difficult to control the length of the ends of the carbon nanotube 14 that becomes attached on the respective conductive bases 32, 42. As such, the carbon nanotube 14 is randomly attached to the one of the tapered tops 322, 422 of the conductive bases 32, 42. The steps from (a) to (d) can be repeated until the carbon nanotube 14 is attached to the predetermined conductive base, in a desired location thereon.

In the step (e), the film of metal 16 is formed on at least the surface portion of the carbon nanotube 14 proximate the conductive base 32, 42 to which it is attached and on at least the attached top of the corresponding conductive base 32, 42 by means, for example, of magnetron sputtering or electron beam evaporation. A thickness of the film of metal 16 is in the approximate range from 1 to 100 nanometers. Preferably, the film of metal 16 is formed on nearly the entire surface of the carbon nanotube 14, leaving the tip thereof uncovered to serve as an emission site, and at least on the portion of top of the corresponding conductive base 32, 42 to which the carbon nanotube 14 is attached. The film of metal 16 beneficially is formed by means of magnetron sputtering and has the thickness of about 20 nanometers.

It is also to be understood that, in step (e), the film of metal can be formed on the entire surface of the carbon nanotube, leaving the tip thereof to be uncovered in a subsequent processing step. The following step can then be adopted after the step (e). An increased voltage is provided to the field emission electron source, thereby causing the carbon nanotube 14 of the field emission electron source to emit electrons. This emission ensures that the second end 144 of the carbon nanotube 14 extends out of the film of metal 16. Due to the emitting of electrons, the film of metal 16 in the emission zone of the carbon nanotube 14 is penetrated/bombarded by the electrons, thereby removing that portion of the film of metal 16, proximate the tip of the carbon nanotube 14. As such, the nanotube tip is thereby exposed to the environment (e.g., vacuum) in which it is to be used. This added step accordingly facilitates a sufficient use of the field emission characteristics of the carbon nanotube 14.

Furthermore, in step (b), an inspecting device can be adopted to inspect and control the assembling process. For instance, in the illustrated embodiment, a resistor (not shown) can be connected in series with the conductive bases 32, 42, and an oscillograph (not shown), in turn, can be connected in parallel with the resistor. When the carbon nanotube 14 is not connected between the tops of the conductive bases 32, 42, the conductive bases 32, 42 are in open circuit. In this state, there is no current flowing through the resistor. When the carbon nanotube 14 is connected between the tops of the conductive bases 32, 42, the conductive bases 32, 42 are in closed circuit. In this state, there is a current flowing through the resistor. Therefore, the oscillograph displays a change of the wave of the resistor. At this time, the voltage 60 can be switched off and the solution 50 can be then removed from the tops 322, 422 of the conductive bases 32, 42. Therefore, the whole assembling process could realize an automatic operation and inspection. The precision, efficiency, and controllability associated therewith are manifestly improved. It should be understood that other inspecting means could be utilized for inspecting and controlling the assembling step, and it is not limited to the illustrated embodiment.

The process of manufacturing the field emission array 20 in FIG. 2 can be executed as follows. Firstly, the cathode layer 22, having a plurality of first conductive bases 12 formed thereon, is directly immersed in the solution 50 carrying carbon nanotubes 14. Secondly, a voltage is applied between a movable second conductive base 42 and one of the first conductive bases 32, and thereby at least one carbon nanotube 14 becomes assembled between the tops 322, 422 of the first and second conductive bases 32, 42, respectively. Thirdly, the movably second conductive base 42 is moved toward another first conductive base 32, and the second step is repeated, thereby at least one carbon nanotube 14 being assembled between the tops 322, 422 of the first and second conductive bases 32, 42. The third step is repeated yet again, and thereby the carbon nanotubes 14 are assembled with the first conductive bases 32, respectively. Finally, a film of metal 16 is formed on surface of the carbon nanotubes 14 and on at least the portion of the tops 322, 422 of all the conductive bases 32, 42 to which the carbon nanotubes 14 are attached, respectively, in order to form the field emission array 20.

Figure 6:
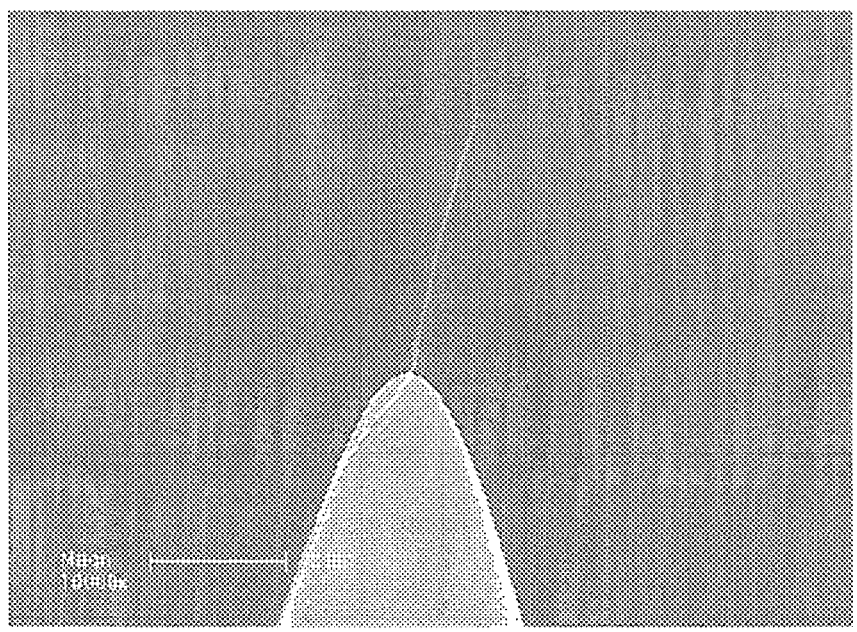
FIG. 6 is a Scanning Electron Microscope (SEM) image of the field emission electron source of FIG. 1.

FIG. 6 is a Scanning Electron Microscope (SEM) image of the field emission electron source 10 of FIG. 1. As shown in FIG. 6, a carbon nanotube is assembled with a top of one conductive base and is aligned to be substantially straight along a longitudinal direction thereof. This alignment occurs because the carbon nanotube is polarized by the electrical field during the assembling process, due to the opposing electrical charges at the two respective ends thereof. During the movement of the carbon nanotube toward the respective tops of the conductive bases, the electrical field exerts a force to opposite ends of the carbon nanotube, resulting in the desired alignment.

The field emission electron source of the present device has the film of metal formed thereon. This film enhances the mechanical connection between the carbon nanotube and the conductive base and reduces the contact resistance therebetween. The second end of the carbon nanotube 14 extends out of the film of metal. That the second end is effectively uncovered facilitates a sufficient use of the field emission characteristics of the carbon nanotube. The present method for manufacturing the present field emission electron source could realize automatic operation and inspection. The precision, efficiency, and controllability associated therewith are manifestly improved. Furthermore, since the relative manufacturing device is simple, the production cost is low. It is suitable for mass production of the field emission electron source.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

We claim:

1. A field emission electron source comprising:
 a conductive base having a tapered top;
 at least one carbon nanotube having a first end and a second end, the first end being electrically and mechanically connected with the tapered top of the conductive base, the second end extending outwardly away from the tapered top of the conductive base; and
 a film of metal formed on a substantial portion of a surface of the carbon nanotube and on at least a portion of the tapered top of the conductive base proximate the carbon nanotube.

2. The field emission electron source as claimed in claim 1, wherein the second end of the carbon nanotube extends out of the film of metal.

3. The field emission electron source as claimed in claim 1, wherein the conductive base is comprised of a material selected from a group consisting of tungsten, gold, molybdenum, and platinum.

4. The field emission electron source as claimed in claim 1, wherein the film of metal is comprised of a noble metal.

5. The field emission electron source as claimed in claim 1, wherein a thickness of the film of the metal is in the approximate range from 1 to 1.00 nanometers.

6. The field emission electron source as claimed in claim 1, wherein a length of the carbon nanotube is about in the range from 10 to 100 micrometers, and a diameter of the carbon nanotube is approximately in the range from 1 to 50 nanometers.

7. The field emission electron source as claimed in claim 1, wherein there is only one carbon nanotube mechanically connected with the tapered top of the conductive base.

8. The field emission electron source as claimed in claim 1, wherein the first end is initially mechanically attached directly to the tapered top of conductive base via van der Waals attractions therebetween.

9. A field emission array comprising:
 a cathode layer; and
 a plurality of field emission electron sources spaced and formed on the cathode layer, wherein the field emission electron source comprising:
 a conductive base having a top;
 at least one carbon nanotube having a first end and a second end, the first end being electrically and mechanically connected with the top of the conductive base, the second end extending outwardly away from the top of the conductive base;
 a film of metal formed on a substantial portion of a surface of the carbon nanotube and on at least a portion of the top of the conductive base proximate the carbon nanotube, wherein the conductive base is erected on and electrically connected to the cathode layer, and the at least one carbon nanotube is electrically connected to the cathode layer via the conductive base.

10. The field emission array as claimed in claim 9, wherein there is only one carbon nanotube mechanically connected with the top of the conductive base.

11. The field emission array as claimed in claim 10, wherein the carbon nanotubes of the respective field emission electron sources are substantially parallel to each other and are substantially perpendicular to the cathode layer.

12. The field emission array as claimed in claim 9, wherein the top of the conductive base is tapered, cone-shaped or column-shaped.

13. The field emission array as claimed in claim 9, wherein the film of metal does not cover the cathode layer.

14. A field emission array comprising:
 a cathode layer;
 a plurality of conductive bases located apart on and supported by the cathode layer, wherein each of the conductive bases has a top;
 at least one carbon nanotube electrically and mechanically connected to the top of each of the conductive bases;
 a film of metal formed on a substantial portion of the carbon nanotube and on at least a portion of the top of each of the conductive bases proximate the carbon nanotube, wherein the at least one carbon nanotube is electrically connected to the cathode layer via the conductive bases.

15. The field emission array as claimed in claim 14, wherein the at least one carbon nanotube has a first end electrically and mechanically connected to the top of the conductive base and a second end extending outwardly away from the top of the conductive base.

16. The field emission array as claimed in claim 14, wherein the top of the conductive base is tapered, cone-shaped or column-shaped.

* * * * *